(12) United States Patent
Shin et al.

(10) Patent No.: US 9,316,414 B2
(45) Date of Patent: Apr. 19, 2016

(54) PHOTOVOLTAIC POWER GENERATION APPARATUS COMPRISING A CYLINDRICAL LIGHT-COLLECTING DEVICE

(76) Inventors: Yu Bin Shin, Yongin-si (KR); Yu Hyun Shin, Yongin-si (KR)

( * ) Notice: Subject to any disclaimer, the term of this patent is extended or adjusted under 35 U.S.C. 154(b) by 593 days.

(21) Appl. No.: 13/699,295

(22) PCT Filed: May 18, 2011

(86) PCT No.: PCT/KR2011/003682
§ 371 (c)(1),
(2), (4) Date: Nov. 20, 2012

(87) PCT Pub. No.: WO2011/145883
PCT Pub. Date: Nov. 24, 2011

(65) Prior Publication Data
US 2013/0061911 A1   Mar. 14, 2013

(30) Foreign Application Priority Data
May 20, 2010   (KR) .................. 10-2010-0047179

(51) Int. Cl.
| | | |
|---|---|---|
| H01L 31/054 | (2014.01) |
| F24J 2/08 | (2006.01) |
| H02S 40/22 | (2014.01) |
| F24J 2/10 | (2006.01) |

(52) U.S. Cl.
CPC ............... *F24J 2/08* (2013.01); *H01L 31/0543* (2014.12); *H02S 40/22* (2014.12); *F24J 2002/1023* (2013.01); *Y02E 10/40* (2013.01); *Y02E 10/52* (2013.01)

(58) Field of Classification Search
CPC .............. H01L 31/052; H01L 31/0521; H01L 31/0543; H01L 31/0547; H02S 40/22
USPC ......................................................... 136/246
See application file for complete search history.

(56) References Cited

U.S. PATENT DOCUMENTS

| | | | |
|---|---|---|---|
| 2009/0277496 A1* | 11/2009 | Khazeni et al. ............... | 136/246 |
| 2010/0132763 A1* | 6/2010 | Dutta ........................... | 136/246 |
| 2011/0259394 A1* | 10/2011 | Krasnov et al. ............... | 136/246 |

FOREIGN PATENT DOCUMENTS

| | | |
|---|---|---|
| JP | 2001-217450 | 8/2001 |
| JP | 2006-310452 | 11/2006 |
| JP | 2009-117446 | 5/2009 |
| KR | 10-1998-0024504 | 7/1998 |

OTHER PUBLICATIONS

International Search Report for PCT/KR2011/003682 Mailed on Feb. 17, 2012.

* cited by examiner

*Primary Examiner* — Jayne Mershon
(74) *Attorney, Agent, or Firm* — Andrus Intellectual Property Law, LLP (57) ABSTRACT

The present invention relates to a photovoltaic power generation apparatus comprising a light-collecting device which collects light to solar cell modules regardless of the migration path of the sun. Photovoltaic power generation involves enabling solar energy to be absorbed into solar cell modules and generating electricity from the solar energy. The photovoltaic power generation apparatus of the present invention comprises: said light-collecting device, which eliminates the need for tracking and moving along with the sun; a small number of solar cell modules which track and move along with the sun; and a device for moving the modules, wherein the photovoltaic power generation apparatus of the present invention generates electricity by means of the light-collecting device, the solar cell modules, and the device for moving the modules, thus significantly reducing the cost of installing and operating photovoltaic power generation facilities.

6 Claims, 5 Drawing Sheets

Apparatus A   Apparatus B   Apparatus C

Fig. 4 morning

Fig. 5 noon

Fig. 6 afternoon

PHOTOVOLTAIC POWER GENERATION APPARATUS COMPRISING A CYLINDRICAL LIGHT-COLLECTING DEVICE

RELATED APPLICATIONS

This application is a 371 application of International Application No. PCT/KR2011/003682, filed May 18, 2011, which in turn claims priority from Korean Patent Application No. 10-2010-0047179, filed May 20, 2010, each of which is incorporated herein by reference in its entirety.

FIELD OF THE INVENTION

A photovoltaic power generation technique is a technique of directly converting infinite solar energy into electrical energy as requirement for actual application of the technique is increased for reasons such as need to reduce greenhouse gases, environmental protection and enlarged application of alternative energy etc. However, the photovoltaic power generation technique is a costly technique in that a lot of expensive solar cell modules have to be used and rotated to accurately track the sun. Thus national policy, environmental regulation and support for subsidy etc. are necessary.

The present invention relates to a photovoltaic power generation apparatus for achieving reduction of investment cost and operation cost of the photovoltaic power generation and structural simplification which comprises a cylindrical light-collecting device designed to function regardless of the incidence angle of sunlight to a solar cell module according to movement path of the sun during the day. Solar cell modules move on the trajectory of focus formed on an opposite side of the light-collecting device according to the movement path of the sun by a device for adjusting the movement of the modules.

DESCRIPTION OF RELATED ART

Density of solar energy arriving at the earth is almost constant, but solar energy absorbed by the ground surface greatly varies according to the incidence angle or the altitude of the sun and efficiency of the photovoltaic power generation also severely varies. Considering such conditions, there are generally two methods for the photovoltaic power generation: a method wherein flat plate-type solar cell module with a large area is directly used and a method wherein solar cell module provided with a light-collecting device is used.

The flat plate-type solar cell module has a simple structure and is easy to be installed and maintained and thus widely used, but it has disadvantages that investment cost is high since a lot of expensive modules are used.

Meanwhile, for a solution for minimizing the number of use of the solar cell modules, various light-collecting techniques such as convex lens, concave mirror, reflective plate, Fresnel lens (Korean Patent Nos. 10-0420868 and 10-0466257) etc. are applied. Since the density of solar energy can be accumulated, electrical energy can be produced with the relatively small number of solar cell modules. However, the photovoltaic power generation apparatus with the light-collecting device has to be rotated to track the sun accurately so that the apparatus can be always perpendicular to the sun, and accordingly a driving device is needed, as a result, a disadvantage is shown that the structure of the apparatus is complex.

According to whether the solar cell module tracks the sun or not, there are fixed type, one-axis tracking type and two-axis tracking type. The fixed type is one wherein the module is fixed toward one direction regardless of the movement of the sun, and can be applied to only flat plate type. Of the one-axis tracking type, a type of tracking the incidence angle of the sun is one wherein the sun is tracked in an east-west direction from the morning to evening and the light-collecting device and solar cell module are rotated by a maximum angle of 180 degrees, and in Korea the rotational angle is 120 degrees from 8:00 a.m. to 4:00 p.m. in which effective sunlight is available. Of the one-axis tracking type, in the case a type of tracking the altitude of sun, the rotational angle in south-north direction according to the altitude of sun is about 40 degrees. The two-axis tracking type is one wherein tracking of the altitude and tracking of the incidence angle are performed simultaneously.

In the case of the conventional tracking-type photovoltaic power generation apparatus provided with the light-collecting device previously mentioned, disadvantages are shown that although the number of use of solar cell modules can be reduced, the photovoltaic power generation apparatus has to be rotated according to the movement of the sun and if the sunlight and light-collecting device deviate from the perpendicularity even in the least, absorption efficiency of the sunlight is drastically decreased, thus precise sunlight-tracking device is required for always keeping the perpendicularity, and since the entire heavier photovoltaic power generation apparatus including the light-collecting device, solar cell modules and sunlight-tracking device has to be rotated according to the movement of the sun, large rotation space is used and a complex driving device is required, and the photovoltaic power generation apparatus has to be supported by a firm, complex and strong structure which can hold the apparatus to prevent it from being distorted due to its own weight, wind, rain or snow.

SUMMARY OF THE PRESENT INVENTION

For solving economical and mechanical problems of the photovoltaic power generation apparatus provided with the conventional light-collecting device, the present invention provides a photovoltaic power generation apparatus which comprises a cylindrical light-collecting device designed to be regardless of an incidence angle of sunlight according to the movement of the sun, solar cell modules movable in an opposite direction to the sun on the trajectory of focus formed on an opposite side of the light-collecting device according to the movement path of the sun and a device for adjusting the movement of the modules.

According to the present invention, since the light-collecting device is provided, the number of use of solar cell modules can be drastically reduced, parts mechanically moved of the entire apparatus are only solar cell modules and device for moving the modules, thus movable parts are minimized, and by controlling the solar cell modules to be positioned on the trajectory of focus, maximum sunlight can be absorbed, so the structure of photovoltaic power generation apparatus can be remarkably simplified and firmly installed, whereby investment cost and operational cost of photovoltaic power generation facility can be drastically reduced.

MODE FOR CARRYING OUT THE INVENTION

Although the position of the sun varies a daily in directions from the east to the west and from the ground to the sky, according to the photovoltaic power generation apparatus comprising a cylindrical light-collecting device (10) of the present invention, the cylindrical light-collecting device has such a structure that it does not have to move while tracking the sun in whichever position the sun is in a day, therefore, sunlight, which has passed through the cylindrical light-collecting device, is concentrated on a focal point positioned on an opposite side of the light-collecting device, and this focal point moves in the opposite direction to the sun, and effective photovoltaic power generation is made possible by arranging small solar cell modules (11) on the trajectory of focal point and through installation for moving these modules.

The cylindrical light-collecting device plays a very significant role in the present invention. When the sunlight incident via the front surface part of the light-collecting device passes through the light-collecting device, the light-collecting device makes the sunlight to be focused on a position distanced from the rear surface part of the light-collecting device by focal length of the light-collecting device due to difference in refractive index. The cylindrical light-collecting device has such a structure that a plurality of cylinders are arranged parallel to one another with a constant distance in a plane. If space between cylinders is too narrow, the incidence of sunlight is hindered by adjacent cylinder, and if the space between cylinders is too wide, the loss of sunlight is significant, therefore, the space is preferably 0.5 to 2 times the diameter of the cylinder. The section of the cylinder may have any shape such as circle, oval, partial circle etc. allowing the light-collecting device to form the focus and not need to move while tracking the sun. The geometrical diameter of the cylinder is determined depending on complexity of the apparatus etc., wherein if the diameter is too small, the size of the solar cell module cannot be reduced to a great extent or the amount of scattering of the sunlight is increased, and the diameter is too large, the facility becomes weighty, therefore, the diameter is preferably 2 to 20 cm. The length of cylinder may be optionally determined within a structurally allowed range. The sunlight, which has passed through the cylindrical light-collecting device, forms the focus having a width smaller than the diameter of the cylinder and is again diffused after traveling over the focal length. That is to say, since the sunlight is concentrated on the focus, if the solar cell modules are arranged in the position of the focus, electrical energy can be obtained with a small number of solar cell modules. The position and width of focus are variables depending on physical properties of the light-collecting device, i.e., its shape, geometrical diameter, refractive index etc. and the longitude and latitude of the sun etc. and thus can be easily determined. The solar cell modules a little lager than the width of the focus are arranged on the focus so as to maximally absorb the concentrated sunlight.

Since the light-collecting device comprises a plurality of cylinders, the plurality of cylinders each form the focus and one solar cell module parallel to the longitudinal direction of the cylinder is arranged on each focus. That is to say, the sunlight, which has passed through one cylinder, is concentrated on one solar cell module arranged on the focus positioned in the rear of the cylinder.

Figure 7:
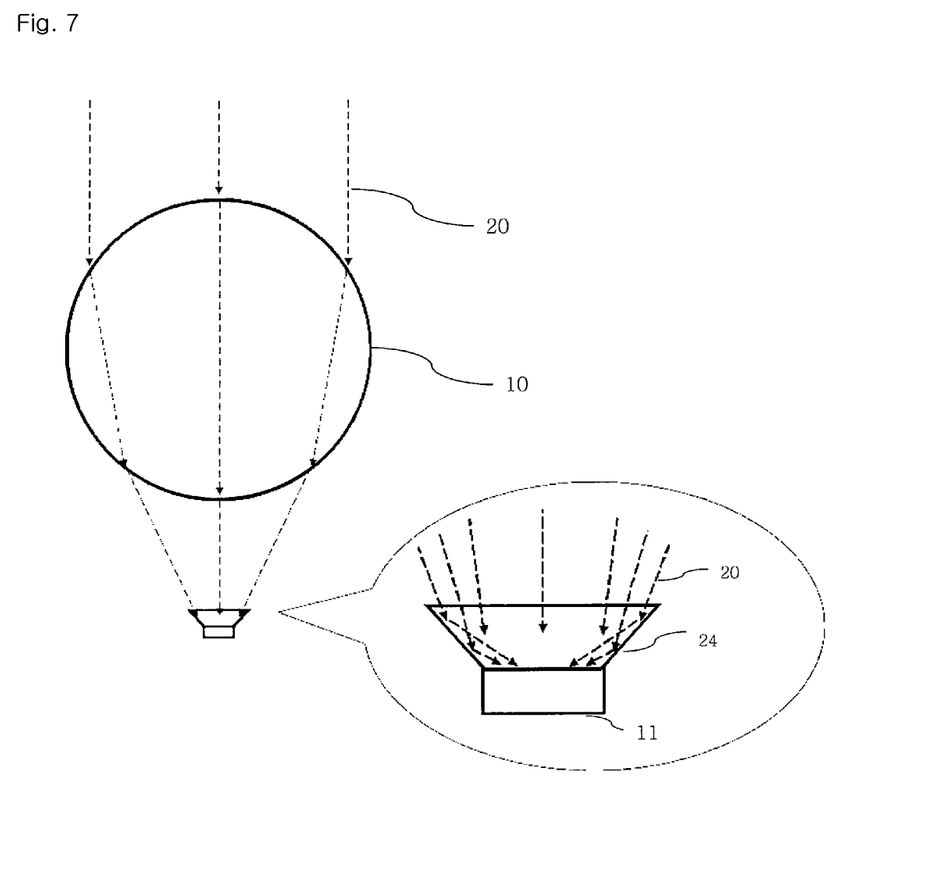
FIG. 7 is a schematic view of a solar cell module with reflective plates on both sides of the solar cell according to the present invention.
Figure 8:
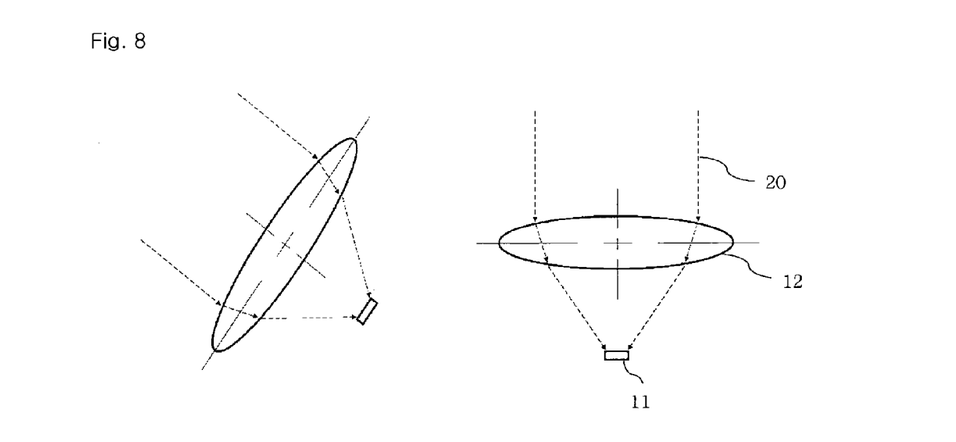
FIG. 8 is a mimetic diagram of sunlight tracking of a photovoltaic power generation apparatus with a conventional convex lens-type light-collecting device, wherein the light-collecting device and module have to be moved along the sunlight and the convex lens has to accurately track the sunlight and if the lens is not perpendicular to the sunlight, the efficiency of power generation is significantly lowered.
Figure 9:
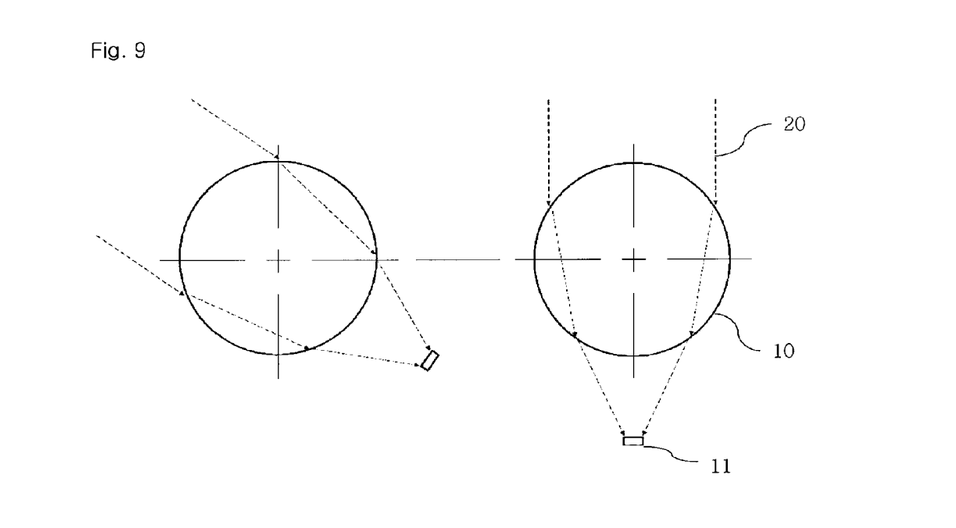
FIG. 9 is a mimetic diagram of sunlight tracking of a photovoltaic power generation apparatus with a cylindrical light-collecting device according to the present invention, wherein regardless of the position of the sun, if only the module is perpendicular to the sunlight, maximum efficiency of power generation can be ensured and the module can be easily made perpendicular to the sun.

Like that the plurality of cylinders are arranged parallel to one another with a constant distance in a plane, the solar cell modules are also arranged parallel to one another at the position of each focus with a constant distance in a plane. The width of the module may be freely determined so as to be remarkably smaller than the diameter of the light-collecting device according to the degree of collection of the sunlight or operational conditions. As illustrated in FIG. 7, thanks to a reflective plate arranged around the solar cell module, the sunlight lost to the outside of the solar cell module can be reflected onto the solar cell module, whereby the loss of sunlight can be minimized and the number of use of solar cells can be further reduced.

For obtaining a different focal length, a rod-type cylinder is used wherein a surface of the cylinder and the inside thereof consist of material having different refractive index, and in the case of a hollow pipe-type cylinder, thermal medium for recovering heat may flow through the cylinder. The rod-type cylinder is fixed to a frame for fixing upper and lower parts of the cylinder and the pipe-type cylinder is connected to a frame designed to enable the thermal medium to flow through the upper and lower parts of the cylinder. The light-collecting device and solar cell module constructed as such can minimize the influence of wind or rain etc. by being relatively simply and firmly fixed since it is only the solar cell module that is moved.

Mechanical device for moving the solar cell module is installed as accessory in the light-collecting device or is installed independently of the light-collecting device, and daily repeatedly moves the solar cell module onto the trajectory of focus created according to the movement of the solar.

In a conventional photovoltaic power generation, all of the light-collecting device and solar cell module have to be moved depending on the altitude of sun, however, according to the present invention, a photovoltaic power generation apparatus is realized which moves the solar cell module onto the trajectory of focus utilizing a principle that the focal length is varied depending on the altitude of sun, thus is independent of the altitude or latitude of the sun. Meanwhile, if part consisting of the cylindrical light-collecting device and solar cell module has such a structure that they are rotated depending on the altitude of sun, the focal length and focal width always constant are always are ensured, whereby the photovoltaic power generation is possible with the optimum number of solar cell modules.

In photovoltaic power generation using conventional light-collecting device the entire system is rotated by an angle of 180 degrees at the maximum, however, in the present invention, through a structure wherein the part consisting of the cylindrical light-collecting device and solar cell module is rotated by an angle of 30 degrees toward the sun and then fixed in the early morning and is rotated again by an angle of 30 degrees toward the sun in the late afternoon, sunshine duration of four hours (i.e., two hours in the morning and afternoon, respectively) can be additionally obtained despite the narrow rotational angle.

That is to say, according to the present invention, a photovoltaic power generation apparatus is provided wherein unlike light-collecting devices of different type, i.e., convex lens or Fresnel lens, a relatively small number of solar cell modules are moved along movement path (21) of the focus of sunlight while most parts of the apparatus are firmly fixed regardless of the movement path of the sun.

EXAMPLE 1

Figure 1:
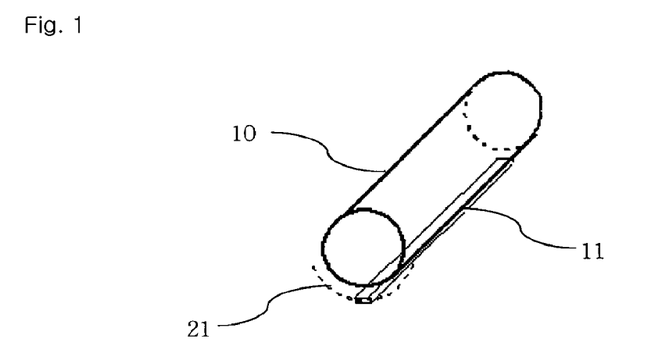
FIG. 1 is a perspective view of a photovoltaic power generation apparatus comprising a light-collecting device and a module according to the present invention, wherein each apparatus is arranged in parallel in a plane.
Figure 2:
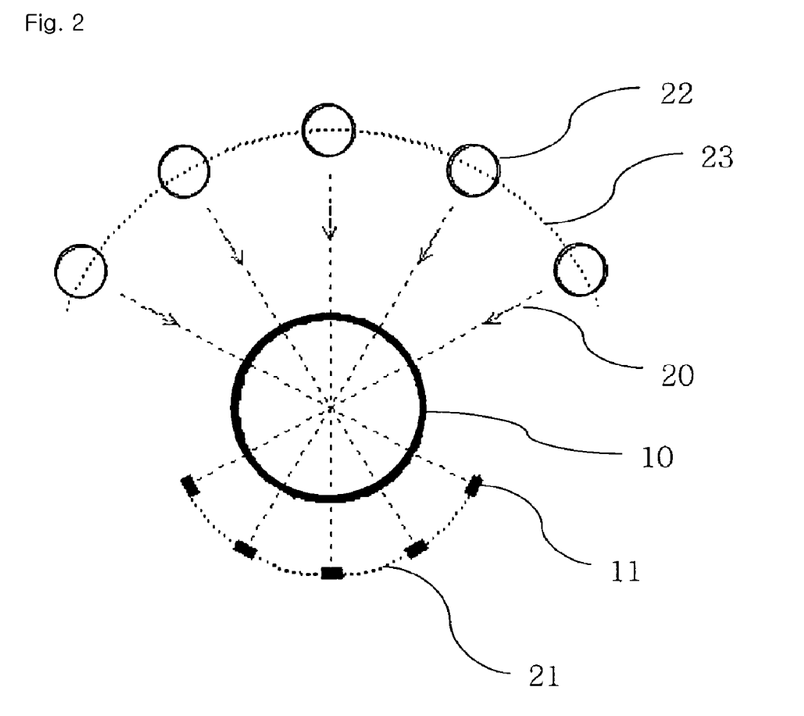
FIG. 2 is a view showing the trajectory of focus of the light-collecting device according to the present invention depending on the position of the sun.
Figure 3:
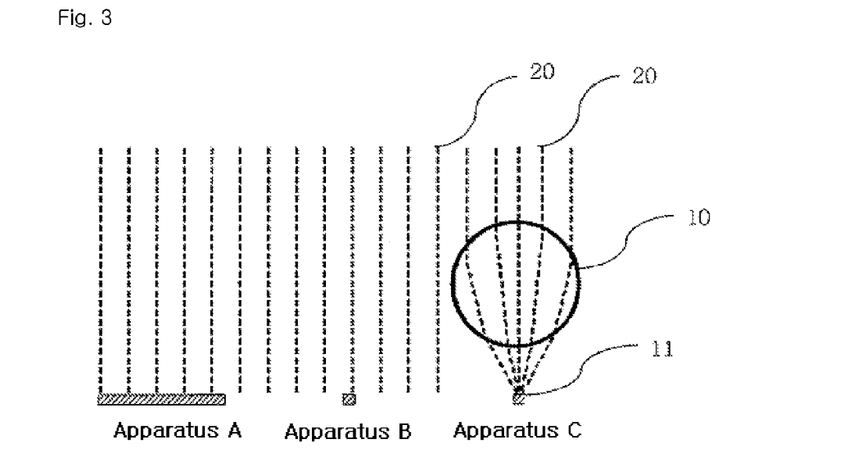
FIG. 3 is a mimetic diagram of incidence on a module of sunlight, wherein in the case of device A the sunlight is incident on large modules, and in the case of device B the sunlight is incident on small modules, and in the case of device C the sunlight is incident on small modules provided with the light-collecting device according to the present invention, and in the cases of the devices A and B the sunlight is directly incident on the module, but in the case of the device C the sunlight is refracted while passing through the light-collecting device and then collected onto a small module.
Figure 4:
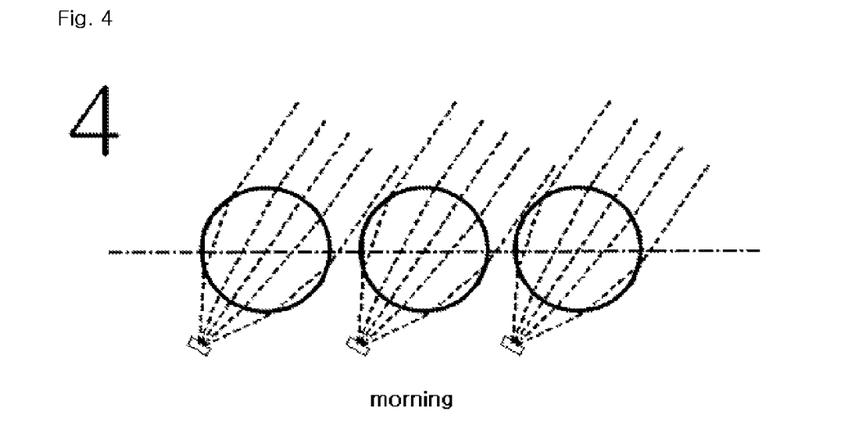
FIG. 4 is a schematic implementation view of the photovoltaic power generation apparatus according to the present invention for positions of the sun in the morning.
Figure 5:
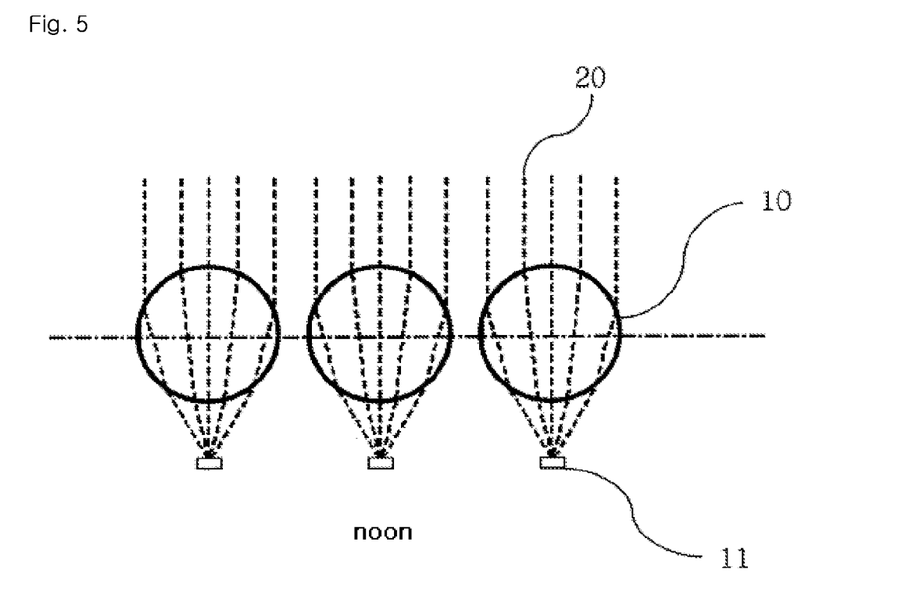
FIG. 5 is a schematic implementation view of the photovoltaic power generation apparatus according to the present invention for positions of the sun in the noon.
Figure 6:
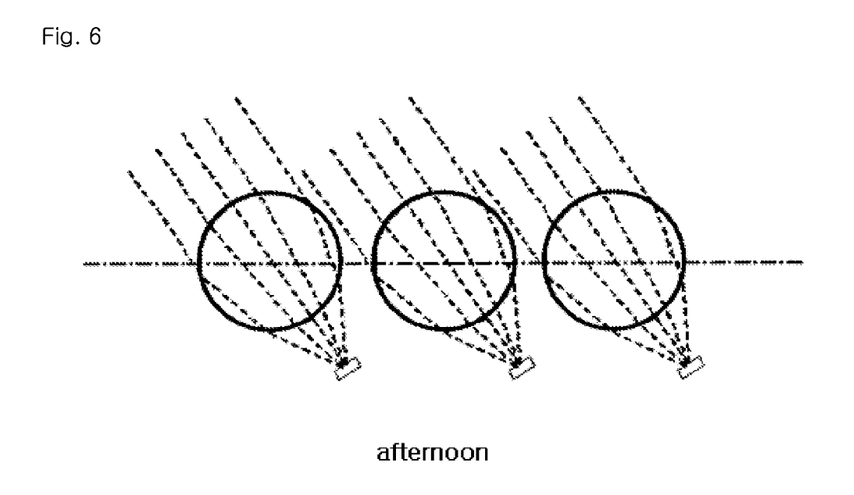
FIG. 6 is a schematic implementation view of the photovoltaic power generation apparatus according to the present invention for positions of the sun in the afternoon.

For recognizing the effect of the cylindrical light-collecting device of the present invention, powers produced in three apparatuses as illustrated in FIG. 3 was measured. The powers are shown in the following Table 1 which were produced in apparatus A having no light-collecting device and having a solar cell module with a width of 30 mm, apparatus B having no light-collecting device and having a solar cell module with a width of 2 mm and apparatus C having a cylindrical light-collecting device with a diameter of 30 mm and having a solar cell module with a width of 2 mm arranged on the focus of sunlight. Since the electrical power is proportional to the size of the module in the case of absence of the light-collecting device, many solar cell modules have to be used in order to produce a lot of power. In the case of the apparatus C having the cylindrical light-collecting device, the power of about 4.7-fold was further produced by the collection of light for a module of the same size (compare apparatus B and apparatus C)

TABLE 1

|  | light-collecting device | the width of module (mm) | ratio of use of module | power (mW) | ratio of production of power |
|---|---|---|---|---|---|
| Apparatus A | no | 30 | 1500% | 173 | 1440% |
| Apparatus B | no | 2 | 100% | 12 | 100% |
| Apparatus C | cylindrical light-collecting device with a diameter of 30 mm | 2 | 100% | 57 | 475% |

EXAMPLE 2

Power was measured over time from 9:00 a.m. to 3:00 p.m. which was produced in apparatus C that had the cylindrical light-collecting device with a diameter of 30 mm and had the solar cell module with a width of 2 mm arranged on the position of focus of sunlight. While the cylindrical light-collecting device was in no way rotated or moved, only solar cell module with a width of 2 mm was moved along the trajectory of the sun, and power could be produced with a maximum efficiency of absorption since the solar cell module always vertically absorbs the solar energy. At this time, it was only the solar cell module moving on the trajectory of the focus of sunlight that was moved, and the distance of movement of the solar cell module was about 45 mm.

TABLE 2

|  | time | | |
|---|---|---|---|
|  | around 9 o'clock | around 12 o'clock | around 15 o'clock |
| power (mW) | 35 | 56 | 47 |

EXAMPLE 3

In a cylindrical light-collecting device wherein a plurality of cylinders are arranged with a constant distance, sunshine duration dependent on the distance was searched in which the sunlight can be concentrated without any influence of adjacent cylinders. When the distance between the cylinders was 0.5 times, 1 times and 2 times the diameter of cylinder, the sunshine duration was about 6 hours, 8 hours and 10 hours, respectively. Considering that maximum sunshine duration is 9 hours in the winter and 12 hours in the summer in Korea, a solution of adding the sunshine duration was devised. The device wherein the distance between the cylinders was 1 times the diameter of cylinder was rotated by an angle of 30 degrees toward the sun at 6:00 a.m. and returned to original position at 8:00 a.m. and then was rotated by an angle of 30 degrees toward the sun at 4:00 p.m., whereby total 12 hours of sunshine duration up to 6:00 p.m. was obtained. Compared with prior art wherein the entire system has to be rotated by an angle of 180 degrees for obtaining the total 12 hours of sunshine duration, 12 hours of sunshine duration was obtained by rotating the cylindrical light-collecting device leftward and rightward by an angle of 30 degrees.

Effects of the Present Invention

In the present invention, effects are very great which are obtained by the photovoltaic power generation apparatus comprising the light-collecting device regardless of the incidence angle of sunlight.

(1) The photovoltaic power generation apparatus provided with the light-collecting device can reduce the number of use of expensive solar cell modules since the density of energy is high thanks to the concentration of sunlight.

(2) Since the shape of the section of the light-collecting device is circular or oval or partially circular etc., the collection of sunlight is possible even if the light-collecting device is not moved or rotated along the sun, whereby there are merits that mechanical devices for moving the light-collecting device is not required, thus the construction of facility is very simplified, and durability is remarkably increased and firm fixing of the facility is facilitated.

(3) Parts needed to move are only small solar cell module arranged on the trajectory of focus of sunlight and device for moving this module, and it is sufficient for even this module to be moved only in a range of movement of the focus of sunlight, thus the range of movement is very narrow and can be achieved even by a simple device. In the case where useful sunshine duration is 8 hours in a day, it is sufficient for the solar cell module to be rotated only by an angle of 120 degrees of the trajectory of the focus of sunlight. Since the light-collecting device is not rotated and is always perpendicular to the sunlight as well, it is not necessary to align the light-collecting device with the sunlight to precisely adjust it, whereby a tracking device is very simplified and it is technically very easy to keep only small solar cell module perpendicular to the sun.

(4) Since the light-collecting device of the present invention has such a structure that a plurality of cylinders are arranged with a constant distance, the sunlight can shine on a lower side of the power generation apparatus through an empty space between the cylinders, and therefore, the light-collecting device can also be installed for lighting of buildings, formation of shade or in agricultural site etc.

(5) Since the light-collecting device of the present invention has the empty space between the cylinders, snow, rain and wind can easily pass through the device and distortion or shake due to them is insignificant, and therefore, the light-collecting device can be relatively easily and firmly installed even in a large-scale facility.

(6) According to the present invention, if liquid such as water is injected into the pipe-type light-collecting device, a portion of solar energy increasing the temperature of solar cell module is first absorbed as thermal energy and the remaining sunlight that has passed through the light-collecting device is then recovered as electrical energy by the solar cell module, whereby the collection of sunlight and collection of heat can be simultaneously achieved.

(7) In the conventional photovoltaic power generation apparatus, if the temperature of solar cell module is much increased due to the collection of sunlight, efficiency of electrical conversion is reduced, therefore, a complex device is required for cooling the solar cell modules to an appropriate temperature, however, in the present invention, the temperature of solar cell module can be controlled by means of relatively simple device by previously recovering a portion of solar energy as solar heat.

(8) According to the present invention, difference in production of energy due to variation of the altitude of sun can be relatively simply coped with. If the altitude of sun is varied, the focal length of the light-collecting device is varied. Therefore, if the solar cell module is moved onto the trajectory of focus reflecting the variation of focal length or the width of solar cell module is determined, the photovoltaic power generation is possible even without the rotation or upward/downward movement of the light-collecting device.

(9) If the inside and outside of cylindrical light-collecting device are made of material having different refractive index, the focal length and the trajectory of focus can be adjusted.

(10) If the reflective plate is arranged around the solar cell module, the sunlight lost around the module can be reflected onto the module, whereby the number of use of solar cell modules can be further reduce d or the efficiency of collection of sunlight can be increased.

Next, in the photovoltaic power generation using the conventional light-collecting device, the entire system is rotated by an maximum angle of 180 degrees, however, in the present invention, the part consisting of the cylindrical light-collecting device and solar cell module is rotated toward the sun in the early morning and thereafter fixed, and is then rotated again toward the sun in the late afternoon, whereby the sunshine duration can be further obtained in the early morning and late afternoon despite the narrow rotational angle.

Next, if the part consisting of the cylindrical light-collecting device and solar cell module is rotated according to the altitude of sun, constant focal length and focal width can be always obtained, whereby the photovoltaic power generation is possible with the optimum number of solar cell modules.

By providing the photovoltaic power generation technique having the above-mentioned effects, the present invention can produce electricity only with the sunlight-collecting device, a small number of solar cell modules and the least device and energy for moving the modules, and solves the problems related to space for the movement of conventional facilities, the length of movement, the weight of facilities, the influence of weather, mechanical firmness durability etc. as previously mentioned and greatly reduces the investment cost and operational cost of the photovoltaic power generation facilities, thereby greatly contributing to extended application to photovoltaic power generation, solar buildings etc.

What is claimed:

1. A photovoltaic power generation apparatus comprising:
  a cylindrical light-collecting device comprising a plurality of longitudinally or axially elongated solid rods or cylinders, wherein the cylindrical light-collecting device passes sunlight incident via a front surface part of each of the rods, refracts and concentrates the sunlight to form a focus at a position distanced from a rear surface part of each of the rods, and each of the rods is not rotating about an axis of each of the rods and the spacing between the rods is equal to 0.5 to 2 times the diameter of each of the rods;
  a plurality of solar cell modules which have a width narrower than the diameter of each of the rods of the cylindrical light-collecting device and are longitudinally elongated and correspond to each of the rods one to one and are located at the position of focus of the cylindrical light-collecting device and are perpendicular to the sunlight; and
  a device which moves the solar cell modules on the trajectory of the focus of the sunlight moving according to an incidence angle of the sunlight in such a way that the solar cell modules remain perpendicular to the sunlight,
  wherein the cylindrical light-collecting device comprises a light-collecting device which forms the focus of the sunlight on an opposite side with respect to an incidence direction of the sunlight and has a section of circular.

2. The photovoltaic power generation apparatus according to claim 1, wherein the cylindrical light-collecting device comprises a pipe-type light-collecting device which allows liquid such as water to flow inside the device, thereby realizing the recovery of solar heat and the photovoltaic power generation simultaneously.

3. The photovoltaic power generation apparatus according to claim 1, wherein the cylindrical light-collecting device comprises a light-collecting device of which the inside and outside consist of materials having different refractive index so as to adjust the focal length.

4. The photovoltaic power generation apparatus according to claim 1, wherein the solar cell module is provided with reflective plates arranged around the module so as to reflect the sunlight lost around the module onto the module to thereby collect the sunlight.

5. A photovoltaic power generation apparatus comprising:
  a cylindrical light-collecting device comprising a plurality of longitudinally or axially elongated solid rods or cylinders, wherein the cylindrical light-collecting device passes sunlight incident via a front surface part of each of the rods, refracts and concentrates the sunlight to form a focus at a position distanced from a rear surface part of each of the rods, and each of the rods is not rotating about an axis of each of the rods and the spacing between the rods is equal to 0.5 to 2 times the diameter of each of the rods;

a plurality of solar cell modules which have a width narrower than the diameter of each of the rods of the cylindrical light-collecting device and are longitudinally elongated and correspond to each of the rods one to one and are located at the position of focus of the cylindrical light-collecting device and are perpendicular to the sunlight; and a device which moves the solar cell modules on the trajectory of the focus of the sunlight moving according to an incidence angle of the sunlight in such a way that the solar cell modules remain perpendicular to the sunlight; and a device for rotating the part consisting of the cylindrical light-collecting device and the solar cell module about an axis, wherein the cylindrical light-collecting device comprises a light-collecting device which forms the focus of the sunlight on an opposite side with respect to an incidence direction of the sunlight and has a section of circular.

6. A photovoltaic power generation apparatus comprising:

a cylindrical light-collecting device comprisin a plurality of longitudinally or axially elongated solid rods or cylinders, wherein the cylindrical light-collecting device passes sunlight incident via a front surface part of each of the rods, refracts and concentrates the sunlight to form a focus at a position distanced from a rear surface part of each of the rods, and each of the rods is not rotating about an axis of each of the rods and the spacing between the rods is equal to 0.5 to 2 times the diameter of each of the rods;

a plurality of solar cell modules which have a width narrower than the diameter of each of the rods of the cylindrical light-collecting device and are longitudinally elongated and correspond to each of the rods one to one and are located at the position of focus of the cylindrical light-collecting device and are perpendicular to the sunlight; and a device which moves the solar cell modules on the trajectory of the focus of the sunlight moving according to an incidence angle of the sunlight in such a way that the solar cell modules remain perpendicular to the sunlight; and a device for rotating the part consisting of the cylindrical light-collecting device and the solar cell module according to the altitude of the sun, wherein the cylindrical light-collecting device comprises a light-collecting device which forms the focus of the sunlight on an opposite side with respect to an incidence direction of the sunlight and has a section of circular.

* * * * *